(12) United States Patent
Steijer et al.

(10) Patent No.: US 6,326,680 B1
(45) Date of Patent: Dec. 4, 2001

(54) INJECTION OF ENCAPSULATING MATERIAL ON A OPTOCOMPONENT

(75) Inventors: Odd Steijer, Bromma; Hans-Christer Moll, Enskede; Paul Eriksen, Tyresö; Jan-Åke Engstrand, Tråognand, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/369,321

(22) Filed: Aug. 6, 1999

Related U.S. Application Data

(62) Division of application No. 08/817,420, filed on Jun. 17, 1997, now Pat. No. 5,970,323.

(30) Foreign Application Priority Data

Oct. 19, 1994 (SE) .................................................. 9403573

(51) Int. Cl.[7] ................................................ H01L 23/495
(52) U.S. Cl. .......................... 257/676; 257/81; 257/99; 257/787; 361/723; 361/772; 361/773; 361/813
(58) Field of Search .............................. 257/81, 99, 666, 257/674, 669, 676, 670, 672, 787, 100; 438/106, 123, 125, 126, 127; 385/59, 63, 65, 86, 87, 88; 361/772, 773, 776, 807, 813, 723

(56) References Cited

U.S. PATENT DOCUMENTS

| | | | |
|---|---|---|---|
| 4,043,027 | * | 8/1977 | Birchler et al. ........................ 29/588 |
| 4,252,407 | * | 2/1981 | Bubanko et al. .................. 350/96.21 |
| 4,778,243 | * | 10/1988 | Finzel ................................. 350/96.21 |
| 5,199,093 | * | 3/1993 | Longhurst ............................ 385/88 |
| 5,218,663 | * | 6/1993 | Isono et al. .......................... 385/129 |
| 5,233,222 | * | 8/1993 | Djennas et al. ....................... 257/676 |
| 5,315,678 | * | 5/1994 | Maekawa et al. ...................... 385/59 |
| 5,367,593 | * | 11/1994 | Lebby et al. ............................ 385/53 |
| 5,489,805 | * | 2/1996 | Hackitt et al. ....................... 257/796 |
| 5,602,951 | * | 2/1997 | Shiota et al. ........................... 385/81 |
| 5,818,990 | * | 10/1998 | Steijer et al. .......................... 385/49 |
| 5,970,323 | * | 10/1999 | Stejer et al. .......................... 438/127 |
| 6,072,229 | * | 6/2000 | Steijer et al. ......................... 257/666 |

FOREIGN PATENT DOCUMENTS

| | | |
|---|---|---|
| 0 361283 A2 | 4/1990 | (EP) . |
| 446410 | * 9/1990 | (EP) . |
| 443508 | * 2/1991 | (EP) . |
| 0 600501 A1 | 6/1994 | (EP) . |
| 3-291606 | * 12/1991 | (JP) . |
| 93/18456 | 9/1993 | (WO) . |

* cited by examiner

*Primary Examiner*—Olik Chaudhuri
*Assistant Examiner*—Alonzo Chambliss
(74) *Attorney, Agent, or Firm*—Burns, Doane, Swecker & Mathis, L.L.P

(57) ABSTRACT

In manufacturing an encapsulated optocomponent, the optocomponent is embedded in a plastics material. The optocomponent has guide grooves on one of its surfaces in which guide pins are to extend so that the encapsulated optocomponent will obtain an optical interface of standard type. For the encapsulating operation guide pins are placed in a mold cavity in a mold half and the optocomponent is placed in the cavity in the mold, so that the guide pins are engaged in the guide grooves and ar accurately inserted therein. To achieve this effect, a resilient or elastic force such as from plunger is applied to the other side of the optocomponent, so that it is pressed with some force against the guide pins. The cavity in the mold is then closed by placing a second mold half on top after which the encapsulating material can be introduced in the closed cavity in the mold. The elastic force can also be obtained directly from a leadframe, to which the optocomponent is attached for electrical connection, or from a small elastic part placed in the cavity in the mold, this part then remaining in the capsule.

3 Claims, 7 Drawing Sheets

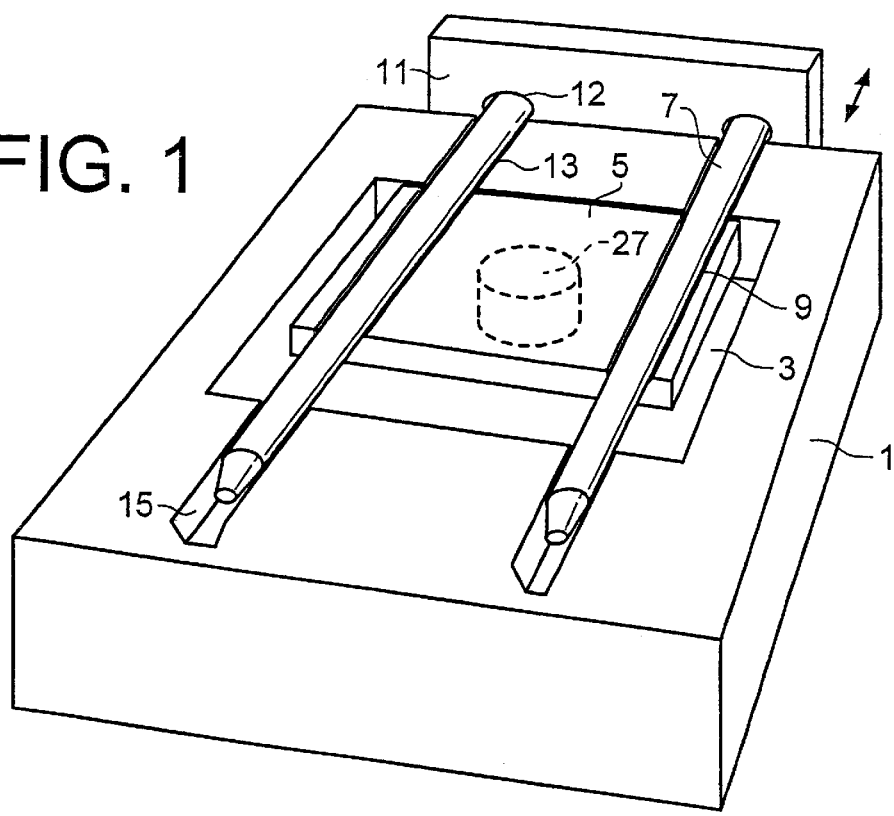
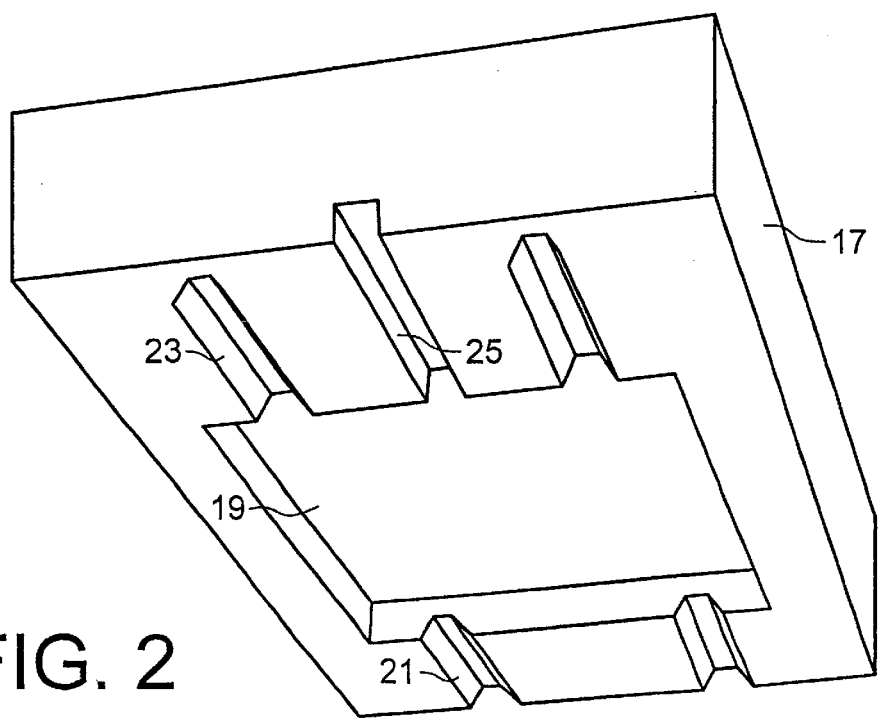

INJECTION OF ENCAPSULATING MATERIAL ON A OPTOCOMPONENT

This application is a divisional, of application Ser. No. 08/817.420, filed Jun. 17, 1997, now U.S. Pat. No. 5,970, 323.

This application comprises an invention which is partly also described in the simultaneously filed applications "Optocomponent capsule having an optical interface" and "Leadframe for an encapsulated optocomponent".

The present invention relates to devices and a method for retaining and positioning optocomponents in a mould cavity during encapsulation of optocomponents by means of transfer moulding.

BACKGROUND

In the earlier Swedish patent application SE-A 9400907-3, filed Mar. 18, 1994, a method is described for encapsulating optocomponents by means of transfer moulding and for achieving at the same time an optical interface in the wall of the capsule. This method was developed based on a conventional encapsulating method for microelectronic circuits, where an electrically conducting leadframe is used for establishing an electric connection to microelectronic circuit chips. The leadframe is usually a punched or etched metal piece, e.g. a thin copper or aluminium sheet. The leadframe comprises a special, suitably adapted portion termed "flag", onto which a microelectronic circuit is mounted before it is moulded into the encapsulating material. Before the moulding embedment, the microcircuit chip is also electrically connected to contact pins of the leadframe by friction welding (ultrasonic welding), "bonding" by means of "bonding" wires.

Moreover, when encapsulating optocomponents an optical interface is to be formed in the wall of the capsule. This, of course, puts additional conditions on the method. The required mechanical accuracy is achieved by mounting the optocomponents on a common carrier or substrate such as a plate, which thereafter is attached to the flag. Finally the carrier is positioned in relation to the external geometry. This is achieved by means of V-grooves on the carrier plate, in which guide pins extending through the mould cavity fit.

However, it can in many cases be difficult to keep, during the moulding embedment, the carrier plate with its guide grooves well engaged with the guide pins, due to the fact that a high pressure is normally required in injection moulding. This pressure can typically be of the magnitude of order of 10–15 bars. Furthermore, the injected material can have a high viscosity, which can also prevent or deteriorate the good alignment of the guide grooves with the guide pins.

Optical fiber connectors having alignment means such as guide pins are disclosed e.g. in U.S. Pat. No. 5,199,093.

In the published European patent applications EP-A2 0 361 283 and EP-A1 0 600 501 typical encapsulated semiconductor devices are disclosed comprising a lead frame.

In the published International patent application WO-A1 93/18456 an integrated circuit package is disclosed having a moulded ring at the edges of the circuit chip enclosing a lead frame. The lead frame has a centrally located flag, having a window and attached to the marginal portions of the bottom side of the chip, the ring and the window allowing access to the bottom side of the chip.

In U.S. Pat. No. 5,233,222 an encapsulated semiconductor device is disclosed having a lead frame comprising a flag, a hole being provided in the flag.

In the published Swedish patent application SE-B 461 456 a mould is disclosed for forming through-holes in a moulded body. The mould has pins engaging at their ends the lower side of a diaphragm, the top side of the diaphragm being subjected to a pressurized fluid.

SUMMARY

It is an object of the invention to provide a method and suitable moulds for manufacturing an encapsulated optocomponent having accurately arranged guide holes for providing an optical interface.

It is an additional object of the invention to provide means for positioning positively and securely an optocomponent at guide pins in the moulding process for producing an encapsulated optocomponent.

It is a further object of the invention to provide means, in the production of an encapsulated optocomponent and when using guide pins for positioning the optocomponent in a mould, so that the guide pins during the encapsulation can be supported as close to the optocomponent or a carrier thereof as possible, for avoiding the risk that the guide pins will be deflected during injection of an encapsulating material, for providing a high accuracy to the positioning of the optocomponent or carrier comprising guide grooves in relation to the guide pins and the guide holes made by them in a moulding process.

It is a further object of the invention to provide an encapsulated optocomponent having provisions of improved thermal dissipation from the component and a leadframe for achieving it.

These and other advantageous objects are achieved by the invention and appear from description hereinafter, the scope of the invention being defined in and the characteristics thereof being set out in the appended claims.

Thus, an encapsulation method is used which is based on the conventional encapsulation process of microelectronic circuits and comprises essentially that a leadframe is used for providing electronic contact between optocomponents and electronic components. Further, in the encapsulating process an optical interface is simultaneously produced at an exterior side of the capsule.

In the encapsulating process it is required, as has been mentioned above, that the carrier or substrate, i.e. the part on which the optocomponents are mounted and which can then be attached to the flag of a leadframe, is adequately positioned during the moulding stage. By providing then, in one embodiment the mould tool with a spring-loaded plunger moving in a cylindrical bore, the plunger is pressed against the bottom side the flag and thereby against the carrier, so that the carrier will remain in a correct position in relation to guide pins during the moulding stage.

The positioning method also implies that the hole, which the plunger after the moulding stage leaves behind next to the bottom side of the flag, can be efficiently used for dissipation of thermal heat generated by the optocomponent. A cooling flange of a heat conducting material can then be mounted directly against the embedded optocomponent or flag and provide a good thermal dissipation.

Generally a method for production of an encapsulated optocomponent, in which the optocomponent is moulded into an encapsulating material, in particular a plastics material, comprises that first an optocomponent is manufactured or provided. The component shall comprise guide grooves or positioning grooves on a first, top surface and further it has a second, bottom surface, which is located opposite to the first one, and is generally essentially flat. The guide grooves are highly parallel to each other and are advantageously located next to edges of the optocomponent. The optocomponent can comprise a substrate plate having the guide grooves and carrying an optochip.

In a first case, the optocomponent is positioned by placing guide pins are placed in an opened mould cavity in a suitably designed mould and then placing the optocomponent in the open mould cavity of the mould, so that the guide pins engage the guide grooves. In a second case, the opposite sequential order of these steps can be used, i.e. the optocomponent can first be placed in an opened mould cavity of the mould and then the guide pins are placed in the opened mould cavity, so that the guide pins engage in the guide grooves.

After this, the mould cavity of the mould is closed and a resilient force is applied to the second surface of the optocomponent, so that it is pressed with a force against the guide pins for a correct positioning of the optocomponents having its guide grooves in hard engagement with the guide pins, this force being chosen to be sufficient for maintaining this mutual position. An elastic force can also be applied before the closing of the mould cavity. Thereupon, a normal encapsulating process is performed by introducing, e.g. injecting, the encapsulating material into the closed mould cavity and by making it solidify, by a hardening procedure and/or by cooling. Then the procedure is finished and the mould cavity is opened, the guide pins are pulled out and the moulded body can be removed from the mould cavity.

As is conventional, the optocomponent can be attached to an electrically conducting leadframe for an electric connection of the component before it is placed in the cavity. By a suitable design thereof and in particular of its bridge portions, by means of which the optocomponent is attached to frame portions of the leadframe, a resilient force can be obtained, which contributes to the retainment of the optocomponent having its guide grooves in engagement with the guide pins. The leadframe can comprise a flag, onto which the optocomponent is attached and which can comprise a hole having a considerable extension. Thereby, the optocomponent can become accessible for thermal dissipation.

The resilient force can otherwise be applied by means of a separate device such as a plunger, which with one end surface acts on the second, bottom surface of the optocomponent and which is elastically biassed. The plunger extends through a hole in a bottom of the cavity, in one of the mould halves and into the mould cavity, so that its other end, opposite to the end acting on the optocomponent, is accessible from the outside of the mould for adjustment of its elastic effect. As an alternative, the resilient force can be obtained by means of a loose elastic device, which will remain in the finished capsule. This loose device then suitably acts with one side on the bottom surface of the optocomponent and with an opposite side on a lower bottom surface in the mould cavity and achieves thereby the desired pressing action of the optocomponent plate onto the guide pins.

A mould intended for the method has two mould halves having inner surfaces or separation surfaces, which are intended to be pressed against each other during moulding, and the mould halves have also cavities for forming the mould cavity. Support means are arranged for the mould for supporting at least and advantageously two cylindrical guide pins. The support means comprise grooves on an inner surface of one mould half and these grooves extend from an outer surface of the mould half in to a cavity in the mould half, which forms a portion of the mould cavity. Further, the support means can comprise projections or pedestals, which have support surfaces for guide pins and which extend from the bottom of a mould cavity in one mould half essentially perpendicularly to the inner surface of the mould half and/or perpendicularly to the longitudinal direction of the guide pins.

The plunger providing the pressing effect can generally be described as comprising a pressing surface and as being movable and guided in a cylindrical bore in the bottom or wall of the mould. Its pressing surface can thereby take different positions in the mould cavity. Furthermore, there are elastic means arranged to press the plunger with its pressing surface into the mould cavity and a stop and adjustment device for the movement of the plunger comprising two adjustment positions. By means of this stop and adjustment device, in a first adjustment position, when placing the optocomponent, the movement of the plunger achieved by the resilient devices can be restricted, so that its pressing surface is placed in a predetermined position in the mould cavity and can only move in a direction against the force from the resilient devices. In a second adjustment position, for the hard positioning and retaining action, the same device allows the plunger to move freely in a direction coinciding with the direction of the force from the resilient devices and thus it can hereby press, with the whole force from the resilient devices, against the bottom side of the optocomponent.

The stop and adjustment device comprises in an advantageous embodiment an abutment arranged in the cylindrical bore and a screw, which extends through a through-hole in the abutment and cooperates with a thread in a hole of the plunger. The screw has advantageously a head, which can cooperate with the abutment in order to provide the first adjustment position, so that when the head is in contact with the abutment, the pressing surface of the plunger is located in the predetermined position. The elastic means comprise suitably a compression spring arranged between the abutment and the plunger. Further, the abutment can comprise a thread cooperating with a thread in the cylindrical bore, for adjustment of the abutment at a suitable level in the bore.

The pressing device in the shape of a loose resilient part, which is left in the finished capsule at the moulding embedment, can comprise a preferably flat body intended to be applied against the bottom surface of the optocomponent. Further, there are portions extending from the body, for instance spider-like protruding resilient arms, which are intended to come in contact with and resiliently support a bottom surface in the mould cavity. For this purpose, the protruding parts are all bent in the same direction from a plane passing through the main part, this plane being such, that it extends in parallel to the outline of the optocomponent, when the pressing device is placed in a mould cavity for encapsulation of the component. The portions advantageously protrude from the edges of the main part, except from preferably one edge or to one side of the body. Thereby, the pressing device can be applied with its body next to or at a side surface of the mould cavity, since the optocomponent shall be placed so in the moulding operation in order to achieve an optical interface directly in the capsule wall.

BRIEF DESCRIPTION OF THE DRAWINGS

The invention will now be described in more detail by way of non-limiting embodiments and with reference to the accompanying drawings, in which:

FIG. 1 is a perspective view of a simplified lower mould for manufacturing an encapsulated optocomponent, FIG. 2 is a perspective view of an upper mould to be used together with the mould of FIG. 1.

DETAILED DESCRIPTION

Figure 3:
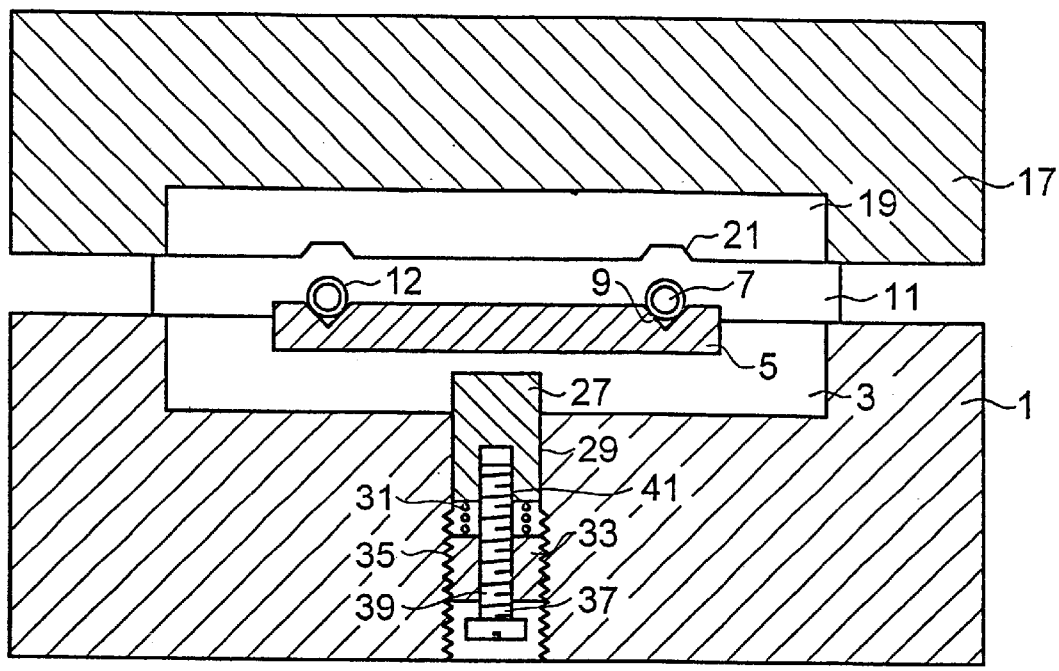
FIG. 3 is a sectional view of the lower and upper moulds of FIGS. 1 and 2, which are placed opposite to and at some distance from each other.

In FIG. 1, one half 1 of a mould for encapsulation of optocomponents is schematically shown in a perspective view. The half shown is a bottom or lower mould portion 1 having an optocomponent 5 placed in a mould cavity 3, the component being kept in a correct or intended position by means of two guide pins 7. The lower mould 1 has generally the shape of a rectangular block having a bottom surface and side surfaces, where the mould cavity 3 also has a rectangular shape and is formed in one of the large surfaces, the top surface of the lower mould 1, so that the edges and surfaces of the mould 1 and the mould cavity 3 are all essentially parallel or perpendicular to each other.

The optical component 5, which can be hybrid type having a substrate plate, e.g. a silicon wafer, and passive or preferably active components mounted thereon, not shown, has the shape of a rectangular plate, which next to and parallel to two of its opposite, rather narrow edges has guide grooves 9, which e.g. can have a triangular shape, as seen in a cross-section, such as a section having the shape of an isosceles triangle, which extends from one of the large surfaces of the component plate 5 and has a top angle of e.g. 45°–60°. The guide grooves are intended for positioning the optical-component plate 5 and therefor, they are placed in engagement with the guide pins 7, so that the pins will be well pressed into the guide grooves 9.

The guide pins 7 have essentially the shape of straight circular cylinders having rounded off tips at their one end and at their other ends they are retained at a plate 11, which in a moulding operation is pressed against a side surface of the whole compressed mould. The guide pins 7 can at their ends at the plate 11 be equipped with heads, not shown, in the same manner as conventional bolts or nails, and with their cylindrical portion pass through bores 12 in the plate 11, which have cross sections, that are a little wider than the diameter of that portions of the guide pins 7 which have a uniform thickness. Further, the cylindrical portions of the pins 7 extend in grooves 13, 15, which with a first segment 13 start at an edge or side surface of the lower mould half 1 and extend in to the mould cavity 3 and with a second, inner segment 15 from the opposite side of the mould cavity 3 some distance on the top surface of the lower mould half 1, however not up to the outer side surface thereof. The two segments 13 and 15 of each groove are aligned with each other and they can both have for instance a cross section having the shape of a rectangle or a symmetric trapezium having oblique sides, which only slightly diverge from a right-angled position, compare below. The depth of the grooves 13, 15 then correspond to half or slightly more of the diameter of the guide pins 7.

The upper mould half 17 of the mould for encapsulation of the optocomponent 5 is schematically shown in a perspective view in FIG. 2 and it has essentially the same general configuration as the lower mould half 1, i.e. it consists of a rectangular block having a top surface, side surfaces and a rectangular mould cavity 19 arranged in a bottom surface. There are also here grooves 21, 23 for the guide pins 7, these segments 21 and 23 of the grooves being aligned with each other and with a first segment 21 extending from one outer side of the upper mould half 17 in to the mould cavity 19. A second segment 23 of the grooves extends from the opposite side of the mould cavity 19 some distance on the bottom surface of the upper mould half 17, without reaching any outer side surface thereof. The cross sections of the grooves 21, 23 are essentially the same as the cross sections of the grooves 13, 15 of the lower mould half and it is particularly important that the bottoms of the grooves 21 and 23 are flat and are located in the same plane.

In the bottom surface of the upper mould half 17, there is also a recess or groove forming a sprue or inlet channel 25 having for instance a rectangular cross section and extending from an outer side of the upper mould half 17 in to the mould cavity 19.

In order to keep the component plate 5 in its correct position in the mould cavity 3 in the lower mould half 1, in contact with the guide pins 7, there is a plunger 27 arranged in the lower mould half, which during the moulding process presses resiliently against the bottom side of the component plate 5, so that the plate is pressed strongly against the guide pins 7 and thus will be placed in the correct position in relation thereto. The upper portion of the plunger 27 is shown with a dashed line in FIG. 1 and is seen more clearly in FIG. 3, which shows a section through the lower and upper halves 1, 17, when they are positioned in parallel to and at a short distance apart from each other and the component plate 5 is put in its place in the mould and the guide pins 7 are inserted. The section is perpendicular to the longitudinal direction of the guide pins 7 and parallel to one of the side surfaces of the mould cavity halves 3, 19.

The plunger 27 is arranged with a slip fit in a bore 29 in the lower mould half 1. The elastic action is achieved by a helical compression spring 31, which presses against the bottom side of the plunger 27 with its one end and with its other end presses against an abutment 33, which through a thread 35, cooperating with a corresponding thread in the bore 29, can be displaced to a suitable position in the bore in order to provide a desired elastic force acting on the plunger 27. The plunger 27 is restricted as to its movement and is prevented from disengaging the bore 29 by a screw 37 passing through a smooth bore 39 in the abutment plug 33 into a threaded blind hole 41, which extends from the bottom side of the plunger 27. Thus, by turning the adjustment plug 33 into a suitable position, a suitable position for the plunger 27 and in particular its top surface can be set. The position is set so that the top side of the plunger is approximately in the same plane as the bottom side of the component plate 5, when it is put into the lower mould half 1. Immediately before the moulding operation the plunger 27 is disengaged by screwing out the screw 37, so that the force from the spring 31 acting on the plunger 27 and thereby on the component plate 5 brings the grooves 9 thereof into engagement with the guide pins 7, whereby the guide pins 7 and the component plate 5 become accurately positioned in relation to each other. Further, the elastic force should not be so large, that there is a risk that the component plate 5 will break. The elastic or resilient force must be large enough to maintain the accurate positioning of the optocomponent plate 5 also during the actual injection process of the encapsulating compound.

Thus, in encapsulation of an optical component plate 5, the lower mould half 1 is prepared by screwing the screw 37 into the blind hole 41 in the plunger 27, so that the head of the screw 37 comes in contact with the free, bottom surface of the abutment plug 33. When the screwing process is continued, the plunger 27 is pulled down towards the abutment plug 33 and the screwing is continued until the top, free surface of the plunger 27 will be located very close to or at a small distance above a level, which the bottom side of the component plate 5 will have in the mould cavity 3 in this mould half. Then, the component plate is placed in the lower mould half 3, as is shown in FIG. 1, the guide pins 7 being placed inserted in the guide grooves 9 of the component plate 5. The plunger 27 is adjusted, so that no embarrassing deflection of the plate 5 and the guide pins 7 can occur. The pressing force keeps the plate 5 in its proper position with the guide grooves in contact with or around the guide pins 7.

Then the upper mould half 17 is lowered and pressed strongly against the lower mould half 1, so that the resulting mould cavity 3, 19 becomes entirely closed except for both the different grooves 13, 15 and 21, 23 in the lower and upper halves respectively, and the inlet channel 25. Hereby, the grooves 13, 15 and 21, 23 of the surfaces of the mould halves which face each other, become positioned just opposite to each other and enclose the guide pins 7, which due to the enlarged holes 12 in the end plate 11 are a little movable in the channels formed by the grooves. Finally, the screw 37 is unscrewed so far from the blind holes 41, that the head of the screw moves freely of the bottom free surface of the abutment plug 33. Hereby, the force from the compression spring 31, acting on the plunger 27, will press it upwards, whereby it will keep the plate 3 strongly in contact with the guide pins 7, so that the plate 5 and the guide pins 7 obtain a very accurately determined position in relation to each other, which is preserved also during later loads thereon, when an encapsulating material is injected.

The plate 11, which carries the guide pins 7, is then pressed against one of the common side surfaces of the bottom and upper mould halves 1, 17 and thereby, the inner mould cavity becomes well sealed. The injection can now be performed by introducing a suitable encapsulating material, e.g. thermosetting plastics or thermosetting resin with a setting agent added thereto, through the inlet channel 25. When the injected material has solidified or set, the mould halves 1 and 17 can be separated, the plate 11 can be removed, whereby the guide pins 7 are extracted from the unit which is now encapsulated. Some plastics is left, which remains in spaces, that correspond to the cavities at the different grooves of the mould halves, but these residuals can easily be removed as can a sprue originating from the inlet groove 25. The encapsulated component can then be removed and subjected to a finishing operation.

Figure 4:
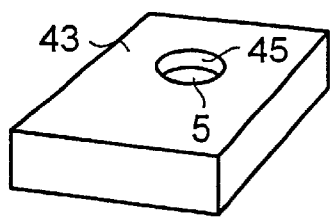
FIG. 4 is a perspective view of an encapsulated optocomponent
Figure 5:
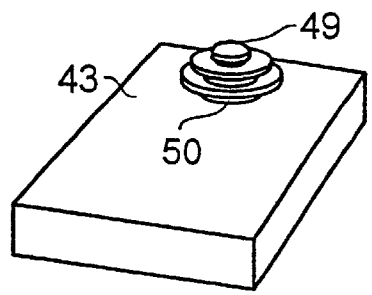
FIG. 5 is a perspective view of an encapsulated optocomponent having a mounted cooling flange.

The finished capsule 43 is schematically shown in a perspective view in FIG. 4 having its bottom side directed upwards. The print of the biassing plunger 27 is a cylindrical hole 45 in the encapsulated component bottom side and this hole extends up to the bottom side of the component plate 5. Hence, through this hole, a good thermal contact can be established with the very component plate 5. In this cylindrical hole 47, in the under side of the encapsulated component can hence a cooling flange unit 49 be mounted, see FIG. 5. The cooling flange unit 49 has a cylindrical portion 50 having a diameter corresponding to the diameter of the hole 45 in the capsule 43, and the end surface of the cylindrical portion 50 is in contact with one side of the optocomponent plate 5, what can provide a good thermal dissipation of energy generated by various components present in or en the component plate 5.

Figure 6:
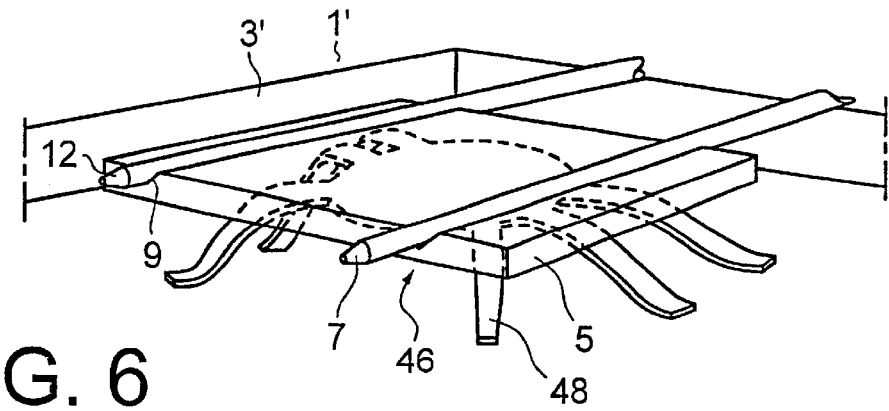
FIG. 6 is a perspective view of a detail of a lower mould in an alternative embodiment comprising a component plate and a pressing device placed therein.
Figure 7:
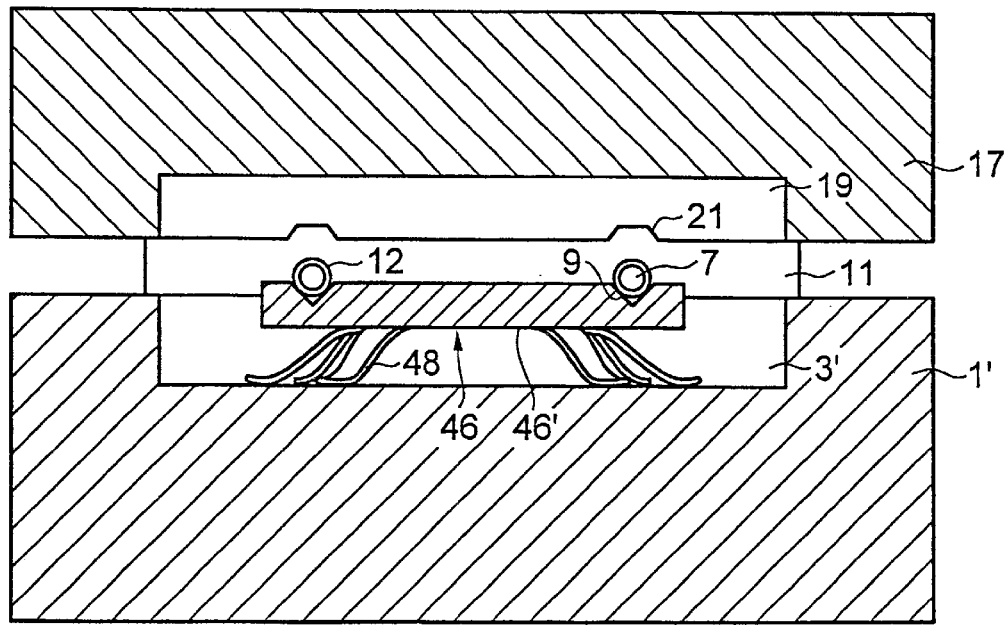
FIG. 7 is a sectional view of mould halves placed at some distance from each other according to the embodiment of FIG. 6.

The pressing force against the component plate 5 can also be achieved by means of a small resilient loose part, which is put under the plate before the insertion of the guide pins 7. Such an embodiment is shown in FIGS. 6 and 7, where the resilient part 46 is shown placed between the lower side of the component plate 5 and the bottom of the cavity 3' in the lower mould half 1'. The resilient part 46 has a body 46' shaped as an oval or rectangular plate, which is intended to be in contact with the bottom side of the component plate 5 and from which, at the edges thereof, resilient, bent protruding parts 48 protrude. These protruding parts 48 are in engagement with the bottom of the mould cavity 3' and are therefor bent, so that they are not located in the same plane as the body 46', but are bent to one side thereof. In the simplest mode for instance only two or three such protruding parts can be arranged, which extend from two opposite edges or three edges located adjacent to each other of the body, in the case it has a rectangular shape. If more protruding parts are arranged in the shape of pins or arms, the resilient part 46 gets a spider-like shape, as is illustrated in the figures.

Further, the thickness of the material and the bending of the protruding parts 48 to one side of the body 46' must be so large, that the resilient part exerts a considerable force on the component plate when being put in the space below the component plate 5, and moreover the material in the part must be chosen, so that this force is maintained during the injection process of encapsulating material, when also the part 46 is enclosed by the encapsulating material and is then left inside the completed embedded component plate. In the embodiment shown, the part 46 has six legs 48 and no legs are arranged at the edge of the body 46', which is located close to a side surface of the lower mould cavity 3'. The part 46 can be manufactured from bent thin metal plate of for instance spring steel. As an alternative, an injection moulded polymer part can be used.

The encapsulated optocomponent 43, the manufacturing procedure of which has been described with reference to FIGS. 1–3, 6 and 7, has for simplicity been shown in these figures without any electrical connections. An optical connection to exterior waveguides such as the fibers in an optical fiber ribbon is presumed to exist at the edge of the optocomponent 5, which is located between the guide grooves 9 and which when placed in the mould is located close to one side of the mould cavity, see FIG. 1, e.g. the side of the mould cavity 3, 19, from which the guide pins 9 are inserted. The manufacture of an encapsulated optocomponent will now be described with reference to FIGS. 8–13c.

Figure 8:
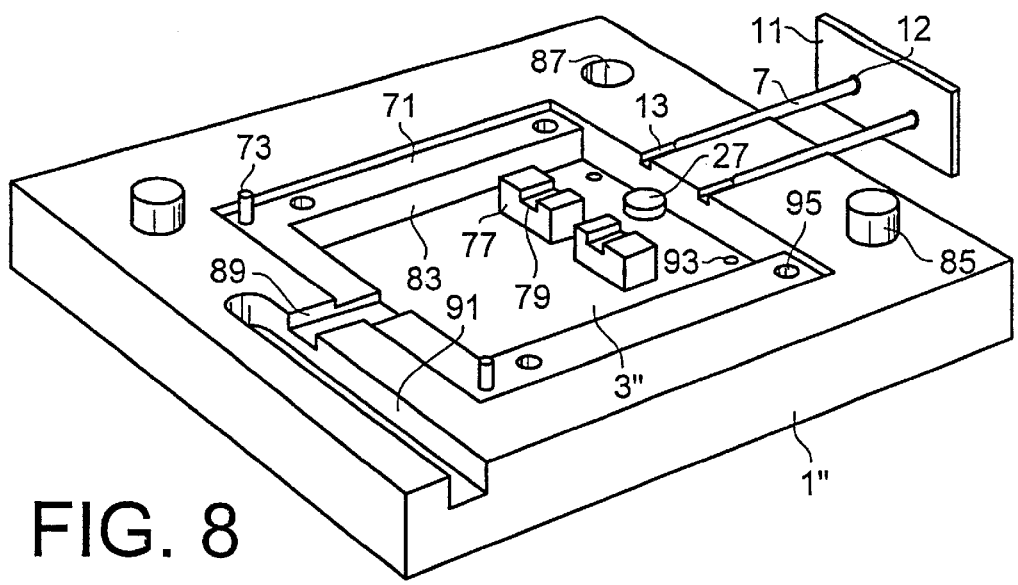
FIG. 8 is a detailed perspective view of a lower mould in a further embodiment for manufacturing an encapsulated optocomponent.
Figure 12:
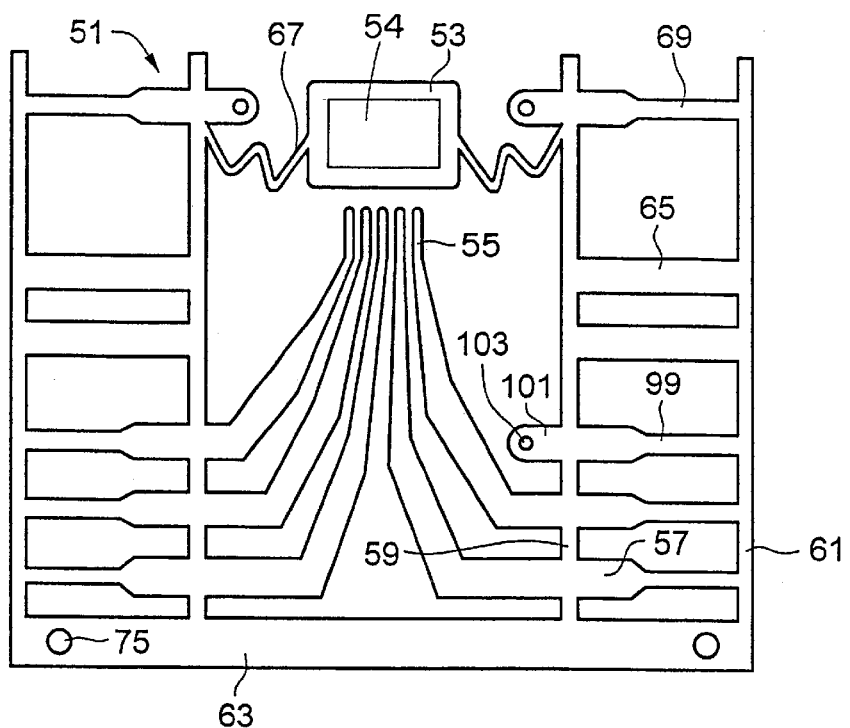
FIG. 12 is a view of a leadframe for the electric connection of an optocomponent.

In FIG. 8 a lower mould half 1" is shown having a mould cavity 3". The lower mould 1" has generally the shape of a rectangular block having a bottom surface and side surfaces, where the mould cavity 3" has also a rectangular shape and is formed in one of the large surfaces, the top surface of the lower mould 1", so that the edges and the surfaces of the mould 1 and the mould cavity 3" all are essentially parallel to or perpendicular to each other. The mould cavity 3" has steps at three of its side surfaces in order to be able to receive also a leadframe 51 of the type, which is shown in FIG. 12 and also in FIG. 10, where the lower mould half 1" is seen from above comprising a leadframe 51 and an optocomponent plate 5" placed therein.

The leadframe 51 has a generally flat shape and is manufactured of thin electrically conducting plate such as copper plate or aluminium plate and can be cut by punching or etching or similar methods. It comprises a flag 53 having the shape of a rectangular plate or part onto which the optocomponent plate 5" is applied, e.g. is cemented by means of a heat conducting adhesive. The flag 53 does not need to be one whole piece, but can comprise a central hole 54 having narrow marginal portions located therearound. The leadframe 51 has a generally rectangular outer contour comprising outer edges, where the flag is centrally located at one of these outer edges, here termed the front edge, so that one of the edges of the flag forms a part of the outer contour of the leadframe 51. Connection fingers 55 extend from that edge of the flag 53, which is directed towards the centre of the leadframe and away from the mentioned front edge of the leadframe 51, and up to contact legs 57.

The contact legs 57 are in the embodiment shown placed perpendicularly to those two edges of the outer contour of the leadframe 51, which have the outer front edge located between them, where the flag 53 is placed. The legs 57 are mutually connected by inner bridges 59, which extend in parallel to and at a distance from the mentioned, opposite edges, and by outer bridges 61 extending along these opposite outer edges. At the fourth or rear edge of the leadframe 51 there is a stronger or wider bridge part 63, from which the more narrow inner and outer bridges 59 and 61 extend. In the areas where there are no contact legs 57, the pair of one inner and one outer bridge 59 and 61 at each side is mutually connected by cross bridges 65 in order to keep these bridge parts attached to each other and for a simpler handling of the leadframe 51.

Hence, in the embodiment shown, the contact legs 57 are placed at the rear portion of the leadframe 51, which is located in the vicinity of the rear outer edge, that is opposite to the front edge, at which the flag 53 is arranged, i.e. they are located at a rather large distance from the flag. Furthermore, the flag 53 is connected to the inner bridges 59 only in the areas at this front edge, where there are no contact pins 57, via more narrow or slimmer zig-zag shaped bridge parts 67, which extend from two opposite edges of the flag 53. These slim bridge parts 65 have, as mentioned, a zig-zag design formed by a band located in one plane or generally an extension having curves or bends to alternatingly one and another direction maintaining a flat shape of the bridge parts. Further, they are attached close to an end portion of the inner bridge portions 59, where also a cross bar 69, which can have the same configuration as the outer portion of a contact leg 57, connects the inner and outer bridge portions 59, 61.

In the lower mould part 1", see FIG. 8, the lead-frame rests on shoulders 71 at three of the sides of the mould cavity 3. The width of these shoulders 71 is adjusted, so that the shoulder ends next to the inner edge of the inner bridges 59 of the leadframe 51 and the inner edge of the wider rear bridge portion 63 of the leadframe, in the respective cases. The height of the shoulders 71 is adjusted, so that the distance between the top surfaces of the shoulders and the lower mould half 1" is approximately equal to the thickness of the electrically conducting lead-frame 51. Fixed guide pins 73 protrude from the shoulder 71 upwards to be placed in holes 75 in the wider rear bridge portion of the lead-frame 51, see FIG. 12, in order to keep the leadframe in a correct position in the mould cavity 3".

For the guide pins 7, like in the first embodiment, grooves 13 are provided on the marginal surface of the top surface of the lower mould half 1", which extend from the outer side surface of this mould half and pass into the mould cavity 3". On the bottom of the mould cavity 3" in the lower mould half 3", there are freely located supports 77, which protrude upwards and have guide grooves 79 on their top surfaces, these guide grooves 79 being located in the extension of the grooves 13 on the marginal surface of the mould half and form inner supports for the guide pins 7, when they are inserted in the mould. The supports 77 are conveniently located adjacent to the inner edge of an optical component plate 5", compare FIG. 3, when this is placed inside the mould cavity 3" next to one of its side surfaces, so that the guide pins 7 run freely over the whole component plate 5" between the supports in the grooves 13 of the lower mould part 1" and the guide grooves 79 on the supports 77 and only over short distances in addition thereto and between the component plate 5" and the support grooves.

Figure 9:
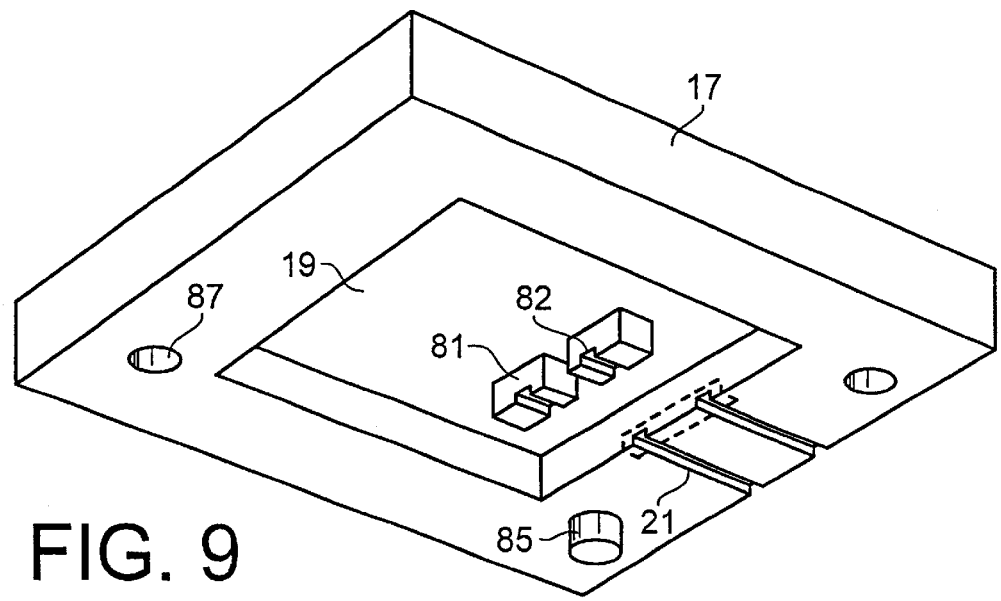
FIG. 9 is a perspective view of an upper mould intended to be used together with the mould of FIG. 8.
Figure 10:
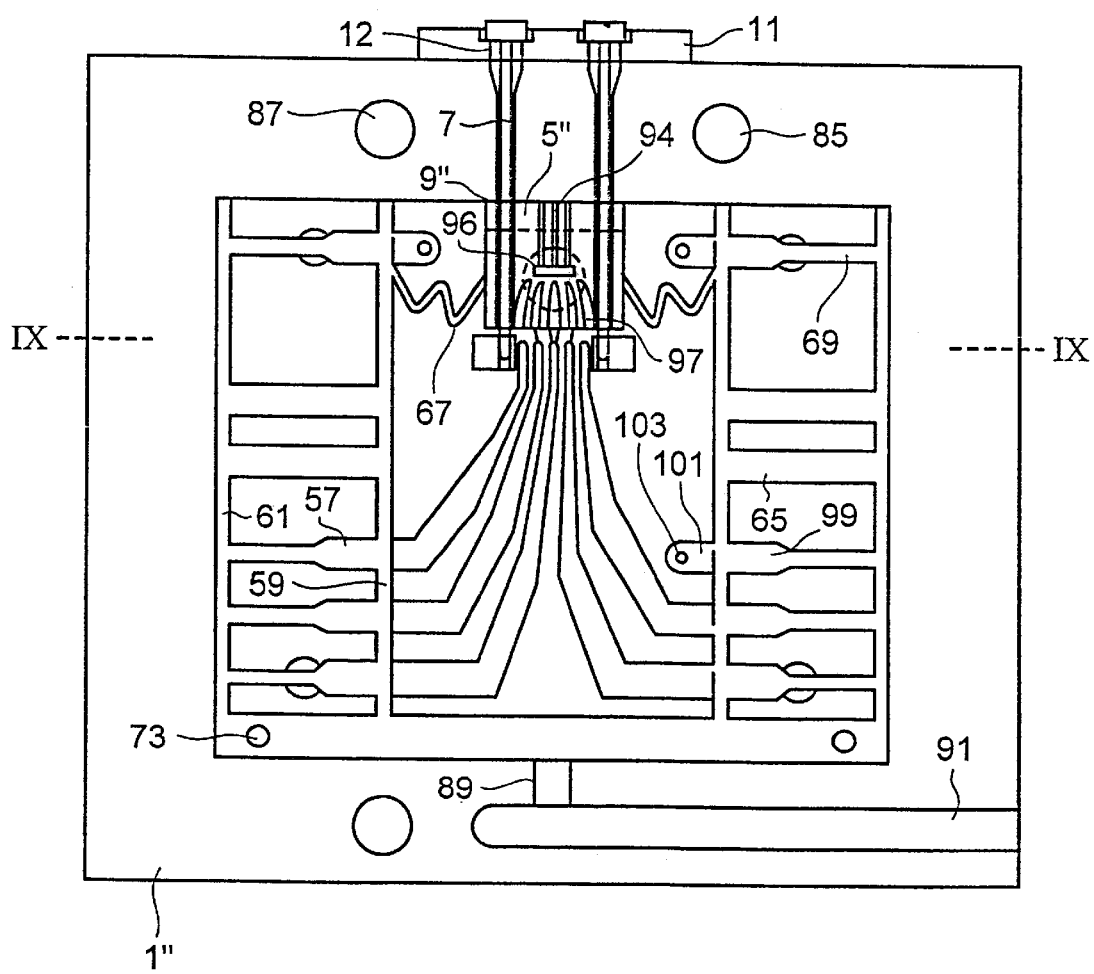
FIG. 10 is a view from above of the lower mould according to FIG. 8 having a leadframe and an optocomponent placed therein.

The upper mould half 17", see the perspective view of FIG. 9, is also configured as a rectangular block having a top surface and a side surfaces, a rectangular mould cavity 19" being formed in the bottom surface of this mould half and having side surfaces and bottom surfaces parallel to and perpendicular to surfaces and edges of the upper mould half 17".

Grooves 21 for the guide pins 7 extend on the lower marginal surface, which is located around the opening for the mould cavity 19", from one side surface of the upper mould half 17" in to the mould cavity 19". In this upper mould cavity also freely placed, protruding supports 81 are provided having support grooves 82 on their end surfaces, these support grooves 82 in the same manner as in the lower mould half constituting an extension of the guide grooves 21 in the very mould half. The upper protruding supports 81 are arranged, so that they, when the two mould halves 1" and 17" are placed on top of each other, are placed exactly above the supports 77 of the lower mould half 1", and further the two support parts 77 and 81 have suitably a similar and rectangular cross section, as viewed perpendicularly to the large bottom and top surfaces of the mould halves.

Figure 13C:
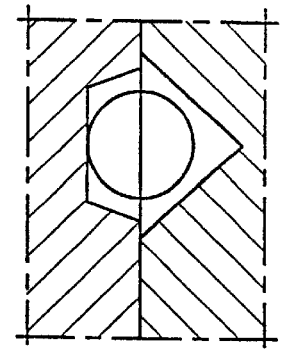
FIGS. 13a–13c are partial sectional views of the profile of support grooves for support pins.
Figure 13B:
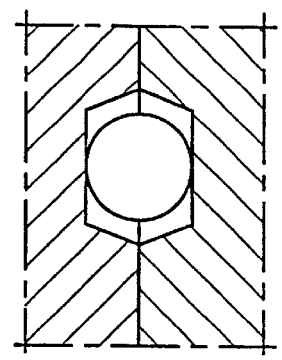
Figure 13A:
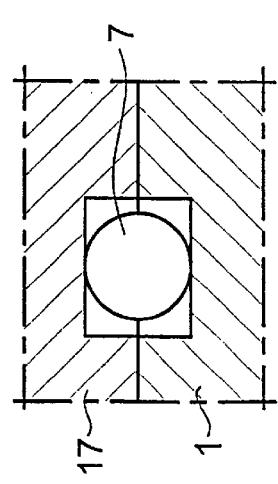

Different shapes of the support grooves 13, 15 and 13, 79 respectively and 21, 23 and 21, 82 respectively of the lower and upper mould halves 1, 1" and 17, 17" appear from the cross sectional views of FIGS. 13a–13c, which are partial sections perpendicular to the longitudinal direction of the grooves, when the mould halves have been applied to each other for moulding the encapsulating material. The grooves can have a rectangular cross section as illustrated in FIG. 13a. Alternatively, the cross section can be a symmetric trapezius having sides diverging a little from a perpendicular position according to FIG. 13b. It can be advantageous to always have the grooves of the upper mould 17, 17" configured with a flat bottom portion as in FIGS. 13a and 13b, so that the guide pins 7 can move a little laterally in order to allow an accurate positioning in relation to a component plate having V-grooves placed in the mould cavity, since the guide pins 7 for a positioning for moulding are pressed in a direction towards the upper mould half 17, 17". The flat bottom portions of the upper grooves should then be located perpendicularly to the direction, in which the guide pins are pressed by their guide grooves in the positioning operation.

For the grooves of the lower mould half, it can, however, be sufficient to design the grooves to have a V-shaped cross section, see FIG. 13c. Such V-grooves can have fairly flat positioned side surfaces, so that the centre angle of the cross section of the grooves considerably exceeds 50–60°, which as has been mentioned above is the normal value for other V-grooves, which are used for the accurate positioning of cylindric bodies, e.g. positioning grooves for a component plate or carrier, see also below. The centre angles can for instance be in the range of 90–120°. The grooves can not in any case by be so large, that encapsulating material will be able to penetrate through the narrow slits next to the guide pins 7 during the moulding. These slits can for instance maximally be allowed to have a largest width of about 20 $\mu$m for commonly used encapsulating materials. The total depth of the grooves of the lower mould half can exceed somewhat the radius of the cylindrical portion of the guide pins 7, and the grooves of the upper mould half can have a depth essentially corresponding to this radius. In any case the total depth, in the case where the grooves of the top and bottom half are placed above and close to each other, shall exceed somewhat the diameter of the cylindrical part of the guide pins 7.

Through the configuration and the positioning of the supports 77 and 81 for the guide pins 7, through-holes 109 will be formed during the embedment of the component plate 5", which pass from one side of the encapsulated component to the other one. These through-holes 109 then also have a rectangular cross section, see the, schematic perspective view of an encapsulated optocomponent 105 in FIG. 14. The mould cavity 19" of the upper mould half 17" has a contour, which essentially follows the contours of the side surfaces 83 of the shoulders 71 extending perpendicularly from the bottom surface of lower mould cavity 31, see FIG. 8, and the side surface of the lower mould cavity 3", next to which the optical component plate 5" is placed during the moulding operation and where also the flag 53 of the leadframe 51 is placed, when this is correctly placed in the mould.

Positioning pins 85 and corresponding holes 87 are arranged on the top surface of the lower mould half 1" and on the bottom surface of the upper mould half 17". These positioning pins place the two mould halves 1", 17" in a mutually correct position during the moulding process.

An inlet channel 89 is arranged as a groove in the lower mould half 1" and extends from the side surface of the mould cavity 3" of this mould half, which is opposite to the side surface, where the guide pins 7 enter. The channel 89 connects to a channel 91 having somewhat larger cross section dimensions, which extends in parallel to the mentioned side surface of the mould cavity 3" up to an outer side surface of the lower mould half 1".

Ejector pins, not shown, can enter through holes shown at 93 through the lower mould half 1" up to the bottom of the mould cavity 3" therein in order to release, after a completed encapsulating moulding operation, the whole capsule from the lower mould half 1". Also holes 95 through the lower mould half, which end on the shoulders 71, where the outer contact legs of the leadframe rest in the mould cavity 1", are intended for ejectors, not shown.

In manufacturing an encapsulated optocomponent using the moulding tools as illustrated in FIGS. 8–11, the optocomponent plate is hence first placed on the flag 53 of the leadframe 51 by means of a suitable heat conducting adhesive, e.g. some epoxy resin containing a metal filler such as silver balls or the like. On the optocomponent plate 5", waveguide elements 94, see FIG. 10, can extend from one edge of the plate, in the preferred case from the edge, which when the optoplate 5" is correctly placed in the lower mould cavity 3", is placed quite next to the side surface of this mould cavity 3", where the grooves 13 for the guide pins 7 end. The waveguides 94 connect to the very optocomponent, shown at 96, which can be an active optical component made as a monolithic unit. The active component unit 96 is by means of connecting wires, not shown, connected to electrical conductive paths 97 on the component plate 5". These conductive paths 97 are then connected at their other ends to the ends of the contact fingers 55 of the leadframe 51 by means of some suitable method, e.g. through soldered wires or better through connecting wires bonded by friction (ultrasonic) welding, not shown.

The leadframe 51 having a component plate 5" attached thereto, which is also electrically connected thereto, is then placed in the lower mould half 1", so that the component plate 5" is placed at the side surface in the mould cavity 3", where the grooves 13 for the guide pins 7 enter, and so that the guide grooves 9" of the optocomponent plate 5" are approximately aligned with these grooves and also with the support grooves 79 of the upstanding supports 77. Further, the inner bridge parts 59, the outer bridge parts 61 and the contact pins 57 running between them, the cross bars 65 and 69, and finally also the wider bridge part 63 rest on the shoulder 71 of the lower mould part 1". Then, the positioning pins 73 are inserted in the corresponding holes 75 of the leadframe in order to keep it in a correct position. The leadframe 51 having the shape of a thin metal foil is then placed having its top surface located in essentially the same plane as the top surface of the lower mould half 1".

Figure 11:
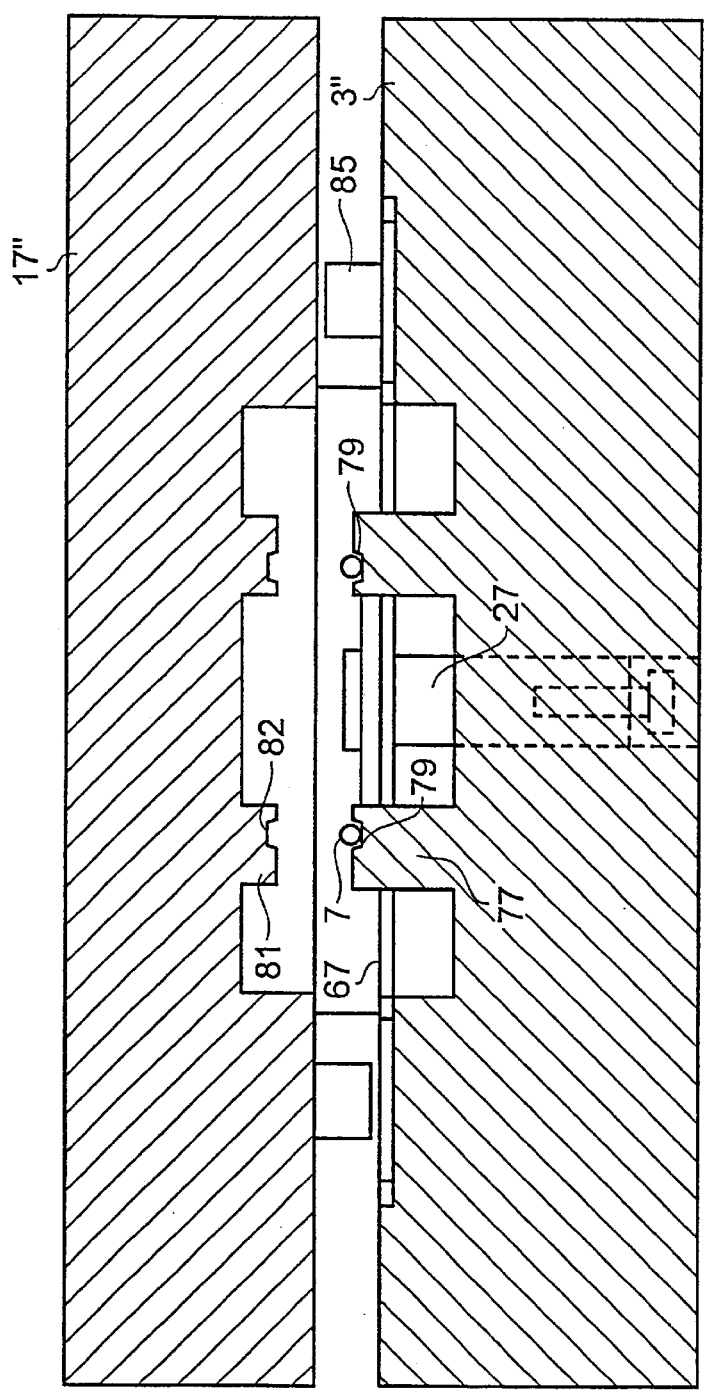
FIG. 11 is a section of the lower and the upper moulds of FIGS. 8 and 9, placed opposite to and at some distance from each other.

A plunger 27, see FIG. 11, is in a manner similar to the first embodiment, initially set with its free upper surface at an adjusted level and comes in contact with the bottom side of the flag 53, so that the bottom side of the flag 53 is located essentially in the same plane as the bottom side of the other parts of the leadframe 51 or so that the flag together with the optical component plate 5" is pressed a small distance upwards from this position. Hereafter, the guide pins 7 are inserted in the corresponding guide grooves 9" of the component plate 5", by a suitable movement of its support plate 11 into contact with the outer side of the lower mould half 1". When the support plate 11 has been advanced, the guide pins 7 will then rest in the guide grooves 9" of the component plate 5" and also be located in the support grooves 79 of the lower upstanding supports 77. After this, the upper mould half 17" is placed, so that the guide pins 85 pass into the corresponding guide holes 87 in the other mould half 1". The guide pins 7 are then still positioned in the guide grooves 9" of the plate 5 and they are definitively positioned and even better retained therein, by releasing the plunger 27, so that it can act elastically upwards against the flag 53 and press it along with the component plate 5" upwards hard against the guide pins 7.

Hence, the component plate 5" together with the leadframe is now completely enclosed in a mould cavity formed by the two mould cavities 3" and 19". The plunger 27 presses the flag 53 of the leadframe 51 upwards and thereby also the component plate 5", so that the guide pins 7 are inserted and accurately positioned in the guide grooves 9". The guide pins 7 will then, with portions close to and outside the locations, where their contact with the guide grooves 9 of the component plate 5 ends, be in engagement with the bottom surface of the upper support grooves 21 and 82. The necessary movement of the optocomponent plate 5" for positioning of its guide grooves 9" against the guide pins 7 is made possible by the zig-zag shaped narrow bridge parts 67, by means of which the flag 53 is connected to the other parts of the leadframe 51. Connecting wires between the optocomponent plate 5" and the contact fingers 55 of the leadframe 55 could be obstructive during the adjustment movement, but these connection wires must be thin and flexible enough to make the exact positioning of the component plate 5" possible with its guide grooves 9" well receiving the guide pins 7. The necessary lateral movement of the guide pins 7 is made possible by the design of the support grooves and by the fact that they due to the enlarged holes 12 in the end plate 11 are a little movable in the channels formed by the support grooves.

The two mould halves 1" and 17" are clamped to each other with a required compression force in order not to be separated during the following injection of a plastics material. Further, the support plate 11 for the guide pins 7 is clamped hard to the side surfaces of the mould halves. Hereafter, a suitable plastics material is injected through the inlet channel formed by the grooves 91, 89 together with the bottom surface of the upper mould half. The injected plastics material is made to solidify, e.g. is made to harden for a suitable time, in the case where the injected plastics material is of thermosetting type.

After this, the mould halves 1" and 17" are separated, suitable ejectors are introduced through the holes 93 and 95 and the encapsulated component is thereby released from the mould halves and in particular from the lower mould half 1". Before this, the guide pins 7 have been extracted from the mould cavity by removal of its support plate 11 from the mould halves 1" and 17".

Hereafter, the encapsulated component can be released from non-desired parts of the leadframe 51. This is made by cutting off the inner and outer bridge parts 59 and 61 respectively on both sides of the contact legs 57 and also on both sides of the special cross bars 69 at the front edge of the optocomponent. When these parts of the inner and outer bridges 59 and 61 have been removed, only the connection legs 57 hence protrude from the sides of the capsule, of which only one, such as the one shown at 99, can have a supporting function. Also the front support pins 69 project from the capsule. These support pins 99 and 69 respectively remain secured to the capsule, by the fact that they have portions 101, see FIGS. 10 and 12, which extend inside the inner bridge part 59, and by the fact that these portions are equipped with anchoring holes 103, in which plastics material can enter during the encapsulation.

Figure 14:
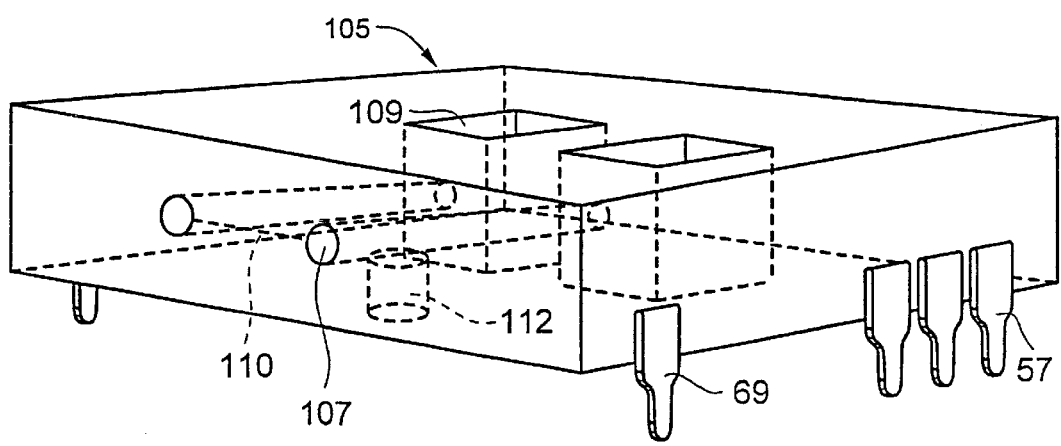
FIG. 14 is a schematic perspective view of an encapsulated optocomponent.

Moulding residues can be left in the holes 109, see FIG. 14, from the supports 77 and 81 for the guide pins 7, and these residues are removed in some suitable manner. Moulding residues in the holes 107 from the guide pins 7 can then easily be pressed out through the first mentioned holes 109. The side of the encapsulated optocapsule, where the holes 107 corresponding to the guide pins 7 end and also the ends of the waveguides 93 are placed, is then polished, so that these ends 110 of the waveguides are exposed in order to be capable of connection with a correspondingly designed optical component unit or an optical connector device having holes for guide pins and having further outer optical connector surfaces placed between the mouths of the holes. Further, the plunger 27 leaves behind a cylindrical hole 112 in the under side of the encapsulated component, which hole extends up to the bottom side of the flag 53 of the leadframe 51 or in the case the flag itself has a hole 54, up to the bottom side of the embedded component plate 5 itself This hole 112 can be used for instance thermal dissipation from the component plate 5 in the same manner, as has been described with reference to FIG. 5, by mounting a cooling flange.

What is claimed is:

1. An encapsulated optoelectric component, comprising:
   an optocomponent carrier having
     connector terminals for electric connection, and
     an optical interface having inlets/outlets for light signals or having waveguide ends and being located on main portions of the optocomponent carrier,
   leadframe parts for electric connection to the connector terminals of the optocomponent carrier, and
   an encapsulating enclosure covering the main portions of the optocomponent carrier and the lead-frame fingers,
   wherein the leadframe parts comprise
     connection fingers, which are electrically connected to the connector terminals on the optocomponent carrier and extend outside the component, and
     a flag attached to and located close to a main part of the optocomponent, the flag comprising a centrally placed hole, whereby a considerable portion of a surface of the optocomponent carrier is accessible through this hole.

2. The component of claim 1, further comprising a hole passing from the outside in through the encapsulating enclosure to connect to the hole in the flag.

3. The component of claim 1, further comprising a cooling flange arranged in the hole through the encapsulating enclosure and through the hole in the flag in contact with a considerable surface of the optocomponent carrier.

* * * * *